United States Patent
Cheong et al.

(10) Patent No.: US 11,855,234 B2
(45) Date of Patent: Dec. 26, 2023

(54) SOLAR CELL AND METHOD OF MANUFACTURING THE SAME

(71) Applicant: Shangrao Jinko solar Technology Development Co., LTD, Jiangxi (CN)

(72) Inventors: Juhwa Cheong, Seoul (KR); Yundeok Yoon, Seoul (KR); Jaesung Kim, Seoul (KR); Junyong Ahn, Seoul (KR)

(73) Assignee: SHANGRAO JINKO SOLAR TECHNOLOGY DEVELOPMENT CO LTD, Jiangxi (CN)

( * ) Notice: Subject to any disclaimer, the term of this patent is extended or adjusted under 35 U.S.C. 154(b) by 828 days.

(21) Appl. No.: 16/933,363

(22) Filed: Jul. 20, 2020

(65) Prior Publication Data

US 2020/0350445 A1 Nov. 5, 2020

Related U.S. Application Data

(62) Division of application No. 15/962,697, filed on Apr. 25, 2018, now abandoned.

(30) Foreign Application Priority Data

Apr. 26, 2017 (KR) .................. 10-2017-0053771

(51) Int. Cl.
*H01L 31/0236* (2006.01)
*H01L 31/18* (2006.01)
(Continued)

(52) U.S. Cl.
CPC .. *H01L 31/02363* (2013.01); *H01L 21/02019* (2013.01); *H01L 31/068* (2013.01); *H01L 31/1804* (2013.01); *Y02E 10/50* (2013.01)

(58) Field of Classification Search
CPC ......... H01L 31/02363; H01L 31/02366; H01L 31/068; H01L 31/022425; H01L 31/1804; Y02E 10/50; Y02E 10/547
See application file for complete search history.

(56) References Cited

U.S. PATENT DOCUMENTS

2012/0181667 A1 7/2012 Geerligs et al.
2012/0288985 A1 11/2012 Moriceau et al.
(Continued)

FOREIGN PATENT DOCUMENTS

CN       105895714 A  *  8/2016
KR  10-2010-0125448 A    11/2010
(Continued)

OTHER PUBLICATIONS

CN-105895714-A—Machine English Translation (Year: 2023).*

*Primary Examiner* — Jose R Diaz
(74) *Attorney, Agent, or Firm* — Tucker Ellis LLP

(57) ABSTRACT

A method of manufacturing a solar cell, includes forming a rounded uneven member having a rounded end portion at a second surface of a semiconductor substrate having a first surface and the second surface opposite to each other, forming conductive regions comprising forming a first conductive region at the first surface of the semiconductor substrate and forming a second conductive region on the second surface of the semiconductor substrate, wherein the second conductive region comprises a semiconductor layer different and separated from the semiconductor substrate and forming electrodes comprising forming a first electrode electrically connected to the first conductive region and forming a second electrode electrically connected to the second conductive region.

20 Claims, 9 Drawing Sheets

(51) Int. Cl.
*H01L 31/068* (2012.01)
*H01L 21/02* (2006.01)

(56) References Cited

U.S. PATENT DOCUMENTS

2014/0299187 A1* 10/2014 Chang ............... H01L 31/02168
136/258
2015/0068594 A1* 3/2015 Nishiyama ............ H01L 31/186
438/71

FOREIGN PATENT DOCUMENTS

| KR | 10-2013-0104309 A | 9/2013 |
| KR | 10-2015-0104431 A | 9/2015 |
| KR | 10-2015-0124292 A | 11/2015 |

* cited by examiner (a)

(b)

SOLAR CELL AND METHOD OF MANUFACTURING THE SAME

CROSS-REFERENCE TO RELATED APPLICATION

This application is a Divisional of U.S. patent application Ser. No. 15/962,697, filed on Apr. 25, 2018, which claims priority to and the benefit of Korean Patent Application No. 10-2017-0053771, filed in the Korean Intellectual Property Office on Apr. 26, 2017, the entire contents of all these applications are hereby expressly incorporated into the present application.

BACKGROUND OF THE INVENTION

Field of the Invention

Embodiments of the invention relate to a solar cell and a method of manufacturing the same, and, more particularly, to a solar cell having an improved structure and a method of manufacturing the same having an improved process.

Description of the Related Art

Recently, as existing energy resources such as oil and coal are expected to be depleted, interest in alternative energy to replace them is increasing. Among them, solar cells are attracting attention as a next generation battery which converts solar energy into electric energy.

Such solar cells are manufactured by forming various layers and electrodes by design. Solar cell efficiency may be determined by the design of these various layers and electrodes. In order to commercialize a solar cell, various layers and electrodes of the solar cell are required to be manufactured so as to improve efficiency, productivity and reliability of the solar cell.

SUMMARY OF THE INVENTION

Therefore, embodiments of the invention have been made in view of the above problems, and the embodiments of the invention are to provide a solar cell and a method of manufacturing the solar cell having improved efficiency, productivity, and reliability.

A solar cell according to an embodiment of the invention includes: a semiconductor substrate; a first conductive region formed on a first surface of the semiconductor substrate and having a first conductivity type; a second conductive region formed on a second surface of the semiconductor substrate opposite to the first surface, and having a second conductivity type opposite to the first conductivity type, wherein the second conductive region including a semiconductor layer different and separated from the semiconductor substrate; a first electrode electrically connected to the first conductive region; and a second electrode electrically connected to the second conductive region. The second surface of the semiconductor substrate has a rounded uneven member having a rounded end portion.

A method of manufacturing a solar cell according to an embodiment of the invention includes: forming a rounded uneven member having a rounded end portion at a second surface of a semiconductor substrate having a first surface and the second surface opposite to each other; forming conductive regions including forming a first conductive region at the first surface of the semiconductor substrate and forming a second conductive region on the second surface of the semiconductor substrate, wherein the second conductive region including a semiconductor layer different and separated from the semiconductor substrate; and forming electrodes including forming a first electrode electrically connected to the first conductive region and forming a second electrode electrically connected to the second conductive region.

According to the embodiment, by forming a rounded uneven member at one surface of a semiconductor substrate on which a conductive region formed of a semiconductor layer separated from the semiconductor substrate is formed, problems that may be caused by a mirror-polishing process can be prevented since the mirror-polishing process is not performed while reflectance at the one surface can be reduced and interface properties at the one surface can be enhanced. Thus, efficiency and reliability of a solar cell can be improved. Also, by forming an uneven portion or an uneven member having a shape different from that of the rounded uneven member at the other surface of the semiconductor substrate opposite to the one surface, reflection at the other surface can be minimized.

In this instance, the rounded uneven member can be formed by a simple process, and thus, a solar cell having excellent efficiency and reliability can be manufactured with high productivity.

DETAILED DESCRIPTION OF THE EMBODIMENTS

Figure 1:
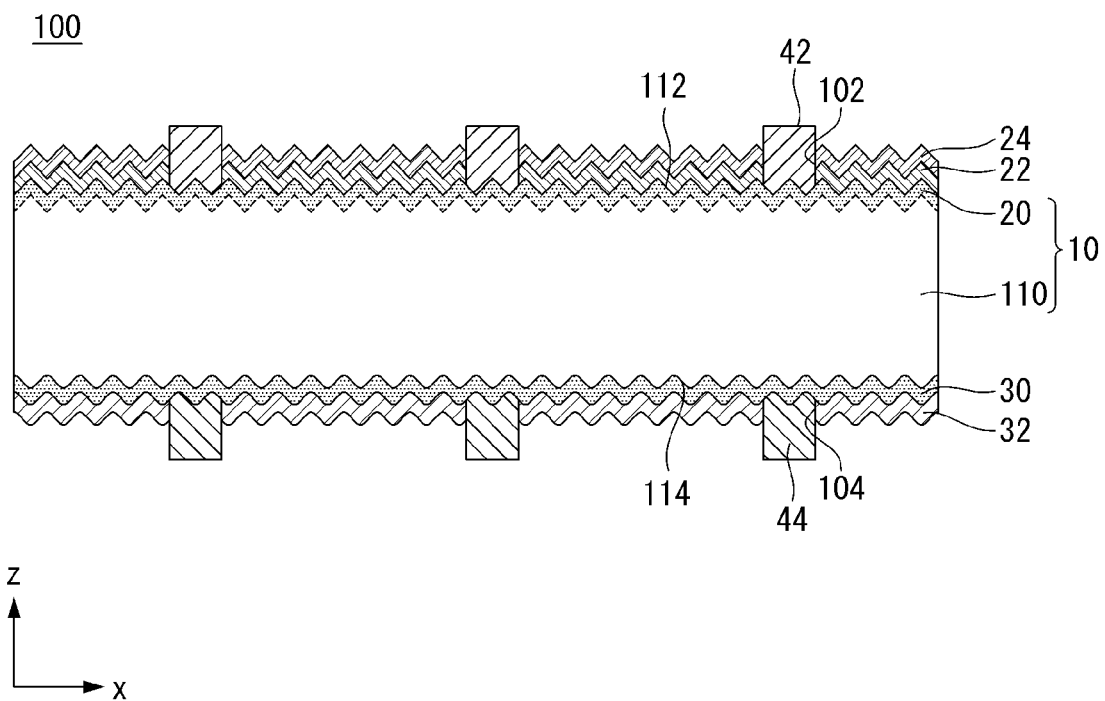
FIG. 1 is a cross-sectional view schematically showing a solar cell according to an embodiment of the invention.

Reference will now be made in detail to various embodiments of the invention, examples of which are illustrated in the accompanying drawings. The invention may, however, be embodied in many alternate forms and should not be construed as limited to the embodiments set forth herein.

In the drawings, illustration of parts unrelated to the embodiments of the invention is omitted for clarity and simplicity of description. The same reference numerals designate the same or similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell and a method of manufacturing the same according to embodiments of the invention will be described in detail with reference to the accompanying drawings. The term of "first" or "second" in this specification is used only to distinguish elements from one another, and no a particular order, and embodiments of the invention are not limited thereto.

Figure 2:
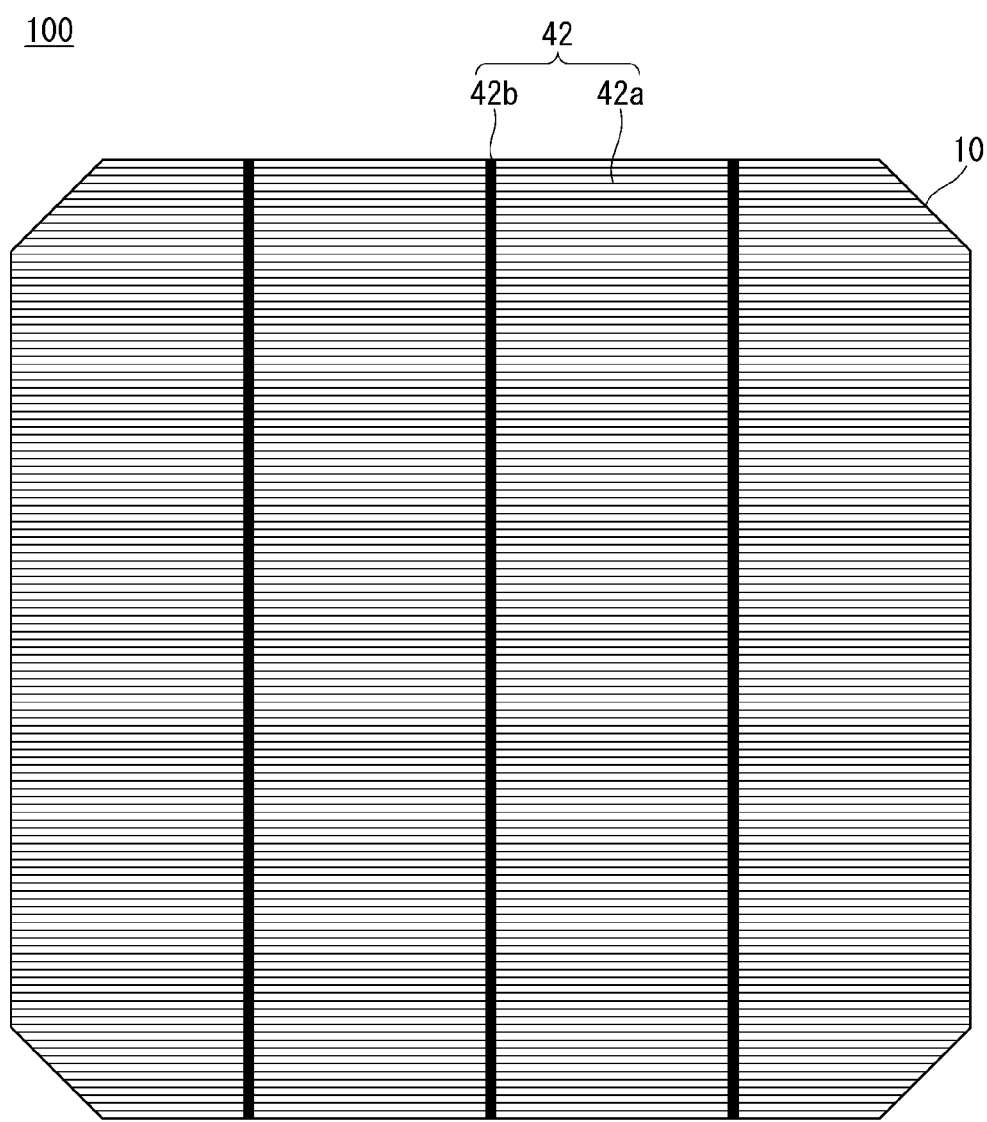
FIG. 2 is a schematic front plan view of the solar cell shown in FIG. 1.
Figure 3:
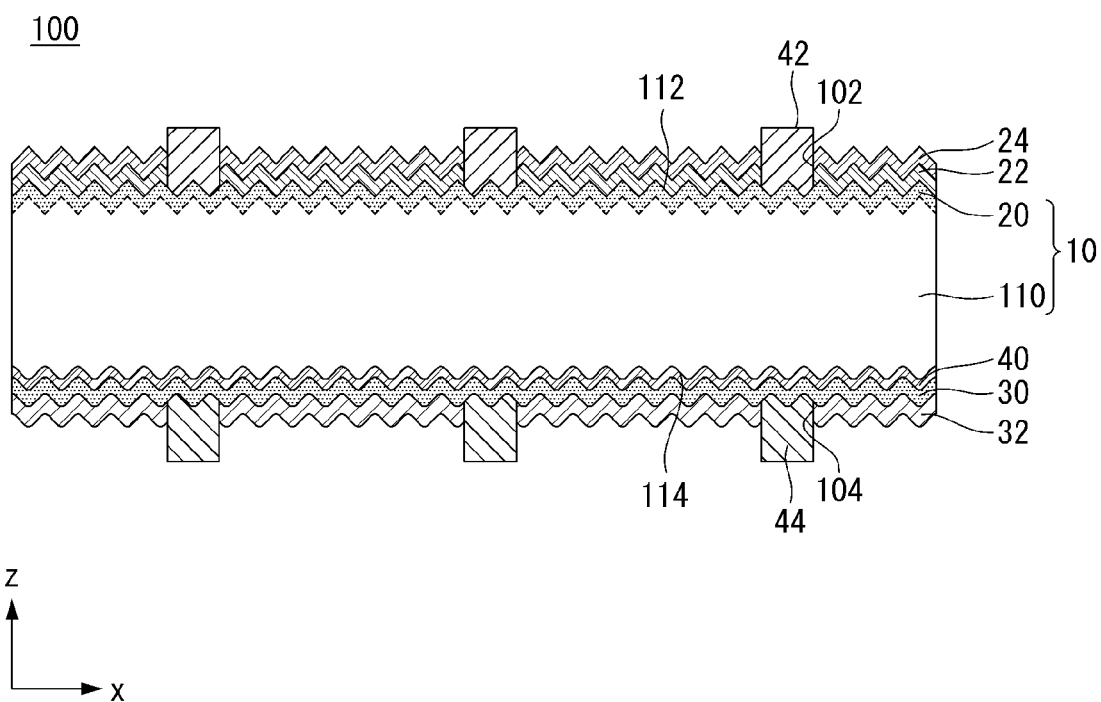
FIG. 3 is a cross-sectional view schematically showing a solar cell according to a modified embodiment of the invention.

FIG. 1 is a cross-sectional view schematically showing a solar cell according to an embodiment of the invention, and FIG. 2 is a schematic front plan view of the solar cell shown in FIG. 1. FIG. 3 is a cross-sectional view schematically showing a solar cell according to a modified embodiment of the invention.

Referring to FIGS. 1 and 2, a solar cell 100 according to an embodiment includes a semiconductor substrate 10, a first conductive region 20, a second conductive region 30, a first electrode 42, and a second electrode 44. The semiconductor substrate 10 may include a base region 110. The first conductive region 20 may be formed at a first surface (e.g., a front surface) of the semiconductor substrate 10 and may have a first conductivity type. The second conductive region 30 may be formed on a second surface (e.g., a back surface) of the semiconductor substrate 10 opposite to the first surface or the front surface and may have a second conductivity type opposite to the first conductivity type. The second conductive region 30 may include or be formed of a semiconductor layer different and separated from the semiconductor substrate 10. The first electrode 42 may be electrically connected to the first conductive region 20, and the second electrode 44 may be electrically connected to the second conductive region 30. In this instance, the second surface of the semiconductor substrate 10 has a rounded uneven member having a rounded end portion. This will be described in more detail.

The semiconductor substrate 10 may include a base region 110 including a first or second conductivity type dopant at a relatively low doping concentration to have a first or second conductivity type. The first or second conductive region 20 or 30 may have a different conductivity type from the base region 110 or the first or second conductive region 20 or 30 may have the same conductivity type as the base region 110 and a higher doping concentration than the base region 110.

One of the first and second conductive regions 20 and 30 having the conductivity type different from that of the base region 110 constitutes at least a part of an emitter region. The emitter region forms a pn junction with the base region 110 to produce a carrier by photoelectric conversion. The other one of the first and second conductive regions 20 and 30 having the same conductivity type as the base region 110 constitutes at least a part of a surface field region. The surface field region forms an electric field that prevents carriers from being lost by recombination at the surface of the semiconductor substrate 10.

In this instance, as the first or second conductivity type dopant, any of various materials which represent an n-type or a p-type may be used. As the p-type dopant, a group III element such as boron (B), aluminum (Al), gallium (Ga), or indium (In) may be used. As the n-type dopant, phosphorus (P), arsenic (Bi), or antimony (Sb) may be used. For example, the p-type dopant may be boron (B) and the n-type dopant may be phosphorus (P).

In the embodiment, the first conductive region 20 may include or be formed of a doped region constituting a part of the semiconductor substrate 10, and the second conductive region 30 may include or be formed of a semiconductor layer separated from the semiconductor substrate 10 and formed on the semiconductor substrate 10.

More specifically, the semiconductor substrate 10, or the base region 110 and the first conductive region 20 formed at the semiconductor substrate 10 may include or be formed of a crystalline semiconductor of one material (e.g., a single-crystalline or polycrystalline semiconductor of one material, as an example, a single-crystalline or polycrystalline silicon, particularly, a single-crystalline silicon). The solar cell 100 based on the base region 110 or the semiconductor substrate 10 having a high degree of crystallinity and having few defects is excellent in electrical properties.

The second conductive region 30 may include or be formed of a separate semiconductor layer having a crystal structure different from that of the semiconductor substrate 10. As an example, the second conductive region 30 may be formed by doping a second conductivity type dopant to an amorphous semiconductor, a microcrystalline semiconductor, or a polycrystalline semiconductor (e.g., amorphous silicon, microcrystalline silicon, or polycrystalline silicon) that can be easily manufactured by any of various methods such as vapor deposition. More particular, the second conductive region 30 may be formed of a polycrystalline semiconductor layer (e.g., a polycrystalline silicon layer). Thus, the second conductive region 30 can have excellent electrical conductivity, and thus, carriers can be smoothly transferred through the second conductive region 30.

In this instance, the second conductive region 30 may be in contact with the semiconductor substrate 10. Thus, the structure can be simplified. As a modified embodiment, as shown in FIG. 3, a control passivation layer 40 may be positioned on (e.g., be in contact with) a back surface of the semiconductor substrate 10, and a second conductive region 30 may be positioned on (e.g., be in contact with) the control passivation layer 40. The control passivation layer 40 may serve as a barrier for preventing diffusion of the second conductivity type dopant of the second conductive region 30 or the material of the second electrode 44 into the semiconductor substrate 10. In this instance, the control passivation layer 40 may have a thickness smaller than thicknesses of first and second insulating layers so as not to disturb a movement of majority carriers. For example, the control passivation layer 40 may have a thickness of 5 nm or less. The control passivation layer 40 may include an oxide, a nitride, a semiconductor, a conductive polymer, or the like. For example, the control passivation layer 40 may be formed of a silicon oxide layer including a silicon oxide that can be easily manufactured, have excellent passivation properties, and smoothly transfer carriers. However, the control passivation layer 40 is not essential, and may be used optionally.

Referring again to FIG. 1, the base region 110 may have a second conductivity type, and thus, the first conductive region 20 may form an emitter region and the second conductive region 30 may form a back surface field region. According to this, the emitter region is positioned on the front surface of the semiconductor substrate 10, and a path of light reaching the pn junction can be minimized. In this instance, the first conductive region 20 is formed of a doped region constituting a part of the semiconductor substrate 10, and thus, absorption of light by the first conductive region 20 can be minimized. An area of the doped region at the semiconductor substrate 10 can be reduced by forming the second conductive region 30 of the separate semiconductor layer on the back surface of the semiconductor substrate 10 where light is relatively less incident. Thus, deterioration of properties of the semiconductor substrate 10 due to the doped region can be minimized.

In the embodiment, the front surface of the semiconductor substrate 10 may have a first uneven portion 112, and the back surface of the semiconductor substrate 10 may have a second uneven portion 114, which is a rounded uneven member. In the specification, "uneven portion" or "uneven member" may be a portion or a member having prominence and depression, irregularity, ruggedness, or convex and concave, or a portion or a member having roughness greater than that of the other portion or that of non-uneven portion or non-even member. In embodiments of the invention, non-even portion or non-even member may also refer to elements that form non-planar or non-flat elements on surfaces. This will be described later in detail with reference to FIGS. 4 to 7.

A first passivation layer 22 and/or an anti-reflection layer 24, which is a first insulating layer, may be formed on (e.g., be in contact with) the front surface of the semiconductor substrate 10 (more particularly, on the first conductive region 20 formed at the front surface of the semiconductor substrate 10). The second passivation layer 32, which is a second insulating layer, may be formed on (e.g., be in contact with) the back surface of the semiconductor substrate 10 (more particularly, on the second conductive region 30 formed on the back surface of the semiconductor substrate 10).

The first passivation layer 22, the anti-reflection layer 24, and the second passivation layer 32 may be formed on a substantially entire portion of the front or back surface of the semiconductor substrate 10 except for openings 102 and 104. For example, the first passivation layer 22, the anti-reflection layer 24, or the second passivation layer 32 may be formed of a single layer or multi-layers in which two or more layers are combined. The single layer or multi-layers may include at least one selected from a silicon nitride layer, a silicon nitride layer including hydrogen, a silicon oxide layer, a silicon oxynitride layer, an aluminum oxide layer, a silicon carbide layer, $MgF_2$, $ZnS$, $TiO_2$, and $CeO_2$. For example, the first passivation layer 22 and/or the anti-reflection layer 24, and the second passivation layer 32 need not include a dopant or the like so as to have good insulating properties, passivation properties, and the like. However, embodiments of the invention are not limited thereto.

The first electrode 42 may fill at least a portion of a first opening 102 and be electrically connected to (e.g., be in contact with) the first conductive region 20, and the second electrode 44 may fill at least a portion of a second opening 104 and be electrically connected to (e.g., be in contact with) the second conductive region 30. The first and second electrodes 42 and 44 may be formed of any of various conductive materials (e.g., a metal) and may have any of various shapes.

Referring to FIG. 2, the first electrode 42 may include a plurality of finger electrodes 42a spaced from each other with a predetermined pitch and formed in one direction. Although it is shown that the finger electrodes 42a are parallel to each other and parallel to an edge of the semiconductor substrate 10, embodiments of the invention are not limited thereto. The first electrode 42 may further include a bus bar electrode 42b formed in a direction crossing (e.g., perpendicular to) the finger electrodes 42a and connecting the finger electrodes 42a. Only one bus bar electrode 42b may be provided or a plurality of bus bar electrodes 42b may be provided with a pitch greater than the pitch of the finger electrodes 42a as shown in FIG. 2. In this instance, a width of the bus bar electrode 42b may be larger than a width of the finger electrode 42a, but embodiments of the invention are not limited thereto. Therefore, the width of the bus bar electrode 42b may be equal to or smaller than the width of the finger electrode 42a.

The second electrode 44 may include a plurality of finger electrodes and a bus bar electrode corresponding to the finger electrodes 42a and the bus bar electrode 42b of the first electrode 42, respectively. The description for the finger electrode 42a and the bus bar electrode 42b of the first electrode 42 may be applied to a finger electrode and a bus bar electrode of the second electrode 44 in the same manner. A width, a pitch, or so on of the finger electrode 42a of the first electrode 42 may be the same as or different from a width, a pitch, or so on of the finger electrode of the second electrode 44. Although a width of the bus bar electrode 42b of the first electrode 42 may be equal to or different from a width of the bus bar electrode of the second electrode 44, the bus bar electrode 42b of the first electrode 42 and the bus bar electrode of the second electrode 44 may be arranged so as to have the same pitch at the same position.

When the first and second electrodes 42 and 44 have a certain pattern as discussed above, the solar cell 100 has a bi-facial structure where light can be incident on the front and back surfaces of the semiconductor substrate 10. Thus, an amount of light used in the solar cell 100 can be increased to contribute to an efficiency improvement of the solar cell 100. However, embodiments of the invention are not limited thereto. Therefore, planar shapes of the first electrode 42 and the second electrode 44 may be different from each other. For example, the second electrode 44 may be entirely positioned on the second conductive region 30. Various other variations are possible.

Figure 5:
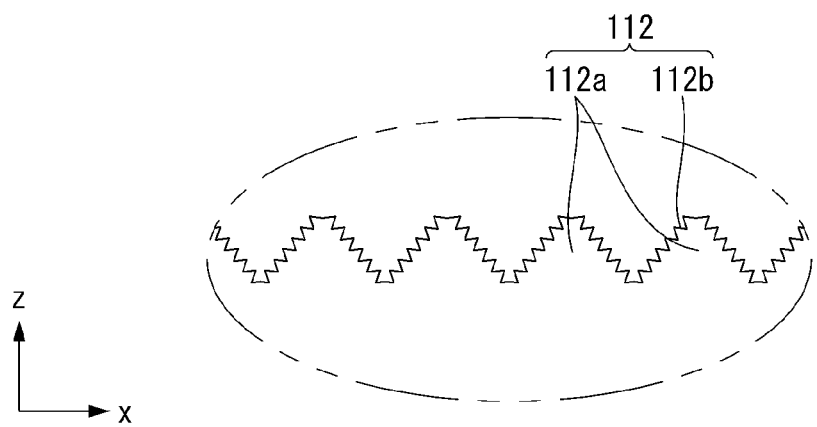
FIGS. 4 to 6 show various examples of first uneven portions of solar cells according to embodiments of the invention.
Figure 6:
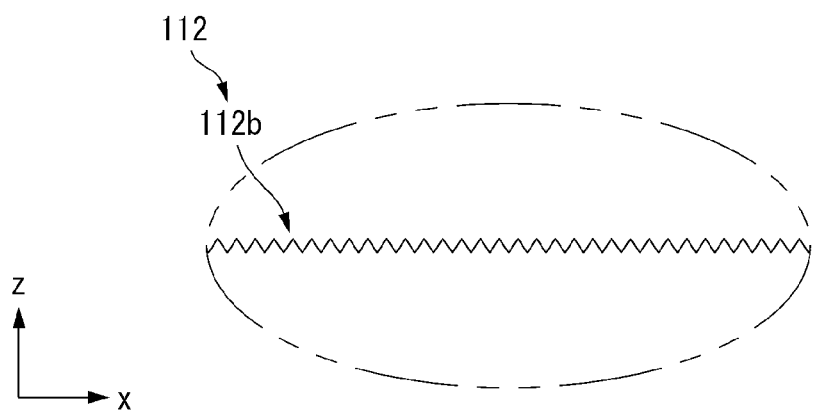
Figure 4:
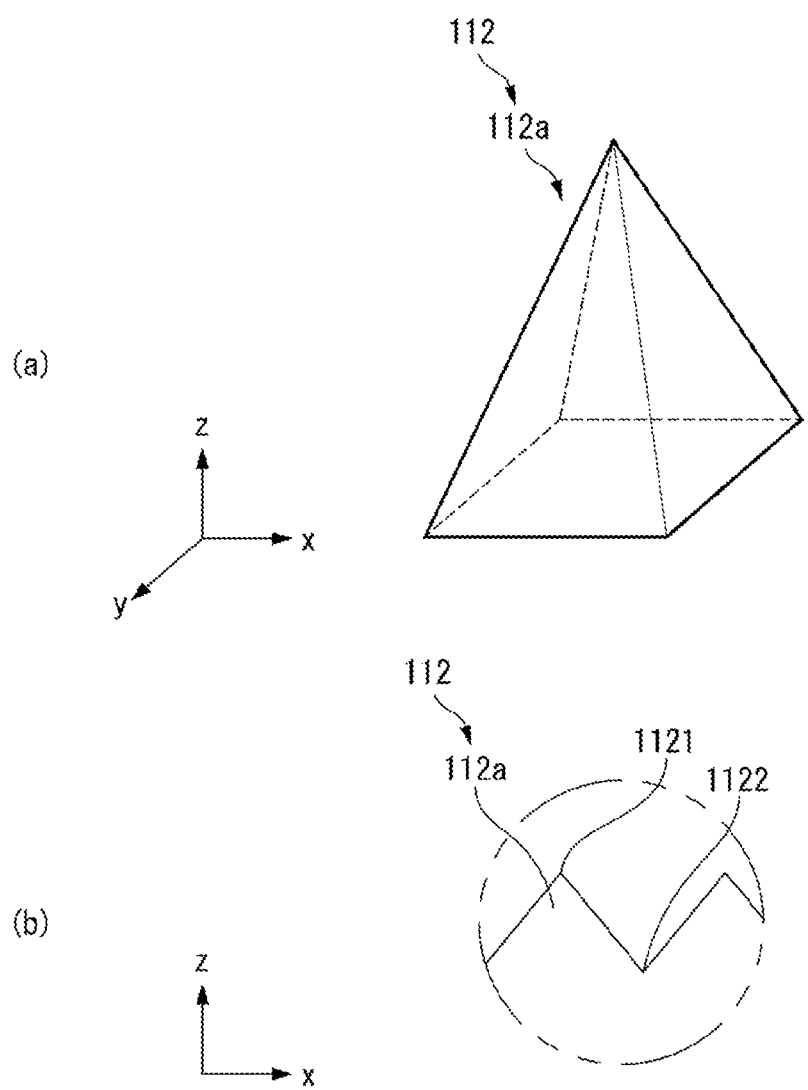
Figure 7:
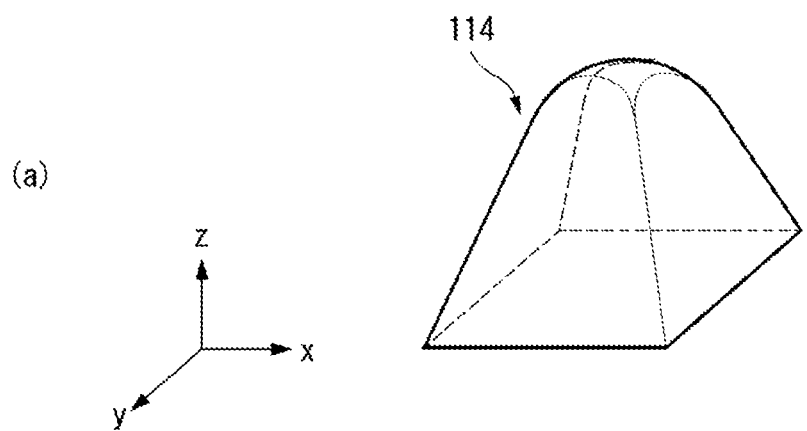
FIG. 7 shows a second uneven portion of a solar cell according to an embodiment of the invention.
Figure 7:
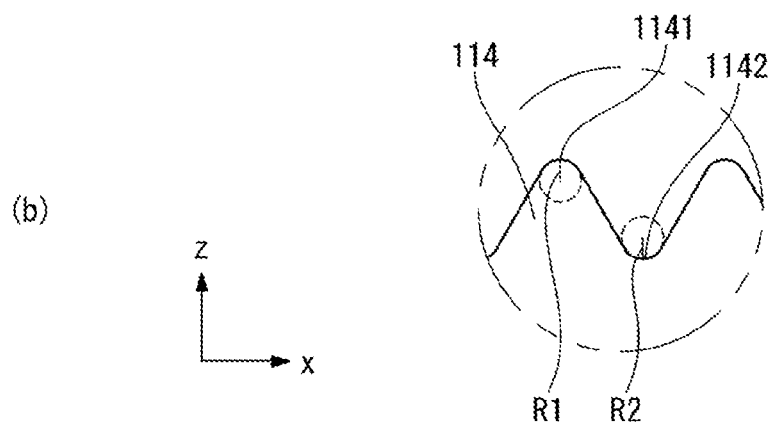

As described above, the front surface and the back surface of the semiconductor substrate 10 have first and second uneven portions 112 and 114, respectively, which will be described with reference to FIGS. 4 and 7 together with FIGS. 1 and 3. FIGS. 4 to 6 show various examples of first uneven portions 112 of solar cells 100 according to embodiments of the invention, and FIG. 7 shows a second uneven portion 114 of a solar cell 100 according to an embodiment of the invention. In this instance, for clearly show and explain the first and second uneven portions 112 and 114, upper and lower portions are reversed in FIG. 7 so that a terminal end portion of the second uneven portion 114 is positioned at an upper portion as in FIGS. 4 to 6.

Referring to FIGS. 4 to 6, in the embodiment, the first uneven portion 112 formed at the front surface of the semiconductor substrate 10 may have a shape different from that of the second uneven portion 114, which is a rounded uneven member.

For example, as shown in FIG. 4, the first uneven portion 112 may be formed of a first uneven member 112a having a pyramid shape formed by a texturing process. The first uneven member 112a is a texturing uneven member formed by a texturing process. In the texturing process, a material constituting the semiconductor substrate 10 is anisotropically etched so that specific crystal planes are remained Thus, the first uneven member 112a has the specific crystal planes. For example, when the semiconductor substrate 10 includes silicon, each of four outer surfaces (or four side surfaces) of the first uneven member 112a is formed of the (111) surface or the (111) plane of the silicon, and thus, the first uneven member 112a has a pyramid shape. A peak 1121 and a valley 1122 which are end portions of the first uneven member 112 that the four (4) of the (111) surfaces meet may be pointed or sharp. For example, a cross-section of the first uneven member 112a may have a shape of a rough isosceles triangle having a sharp corner. This cross-sectional shape of the first uneven member 112a may be due to properties of the material constituting the semiconductor substrate 10.

An average size of the first uneven member 112a (e.g., an average value of heights of the first uneven members 112a) may be a micrometer level (e.g., 1 µm to 1 mm), as an example, and may be approximately 1 µm to 30 µm (e.g., 1 µm to 20 µm). If the average size of the first uneven member 112a is less than 1 µm, the first uneven member 112a may be difficult to be manufactured. When the average size of the first uneven member 112a is 30 µm or less (e.g., 20 um or less), an anti-reflection effect can be enhanced. Also, a deviation of sizes of the first uneven members 112a may have a first deviation which is relatively large.

The first uneven member 112a may be formed by a texturing process, that is, by anisotropic etching using wet etching. When the first uneven member 112a is formed by the wet etching, the first uneven member 112a can be formed within a short time by a simple process. The process of forming the first uneven member 112a by the wet etching will be described later in more detail. Embodiments of the invention are not limited to the above shape, average size, deviation of the sizes, etc. of the first uneven member 112a, and thus, the shape, the average size, the deviation of the sizes, etc. of the first uneven member 112a may be variously modified.

When the first uneven portion 112 is formed of the first uneven member 112a as described above, reflection can be reduced by the texturing structure and the first uneven portion 112 can be easily formed by a simple process using only the texturing process.

As another example, as shown in FIG. 5, a first uneven portion 112 may include a first uneven member 112a and a second uneven member 112b formed at outer surfaces of the first uneven member 112a. The description of the first uneven member 112a with reference to FIG. 4 may be applied to the first uneven member 112a of the present embodiment in the same manner.

The second uneven member 112b may be formed at the outer surfaces (e.g., the (111) surfaces) of the first uneven member 112a. The second uneven member 112b may be a fine uneven member having a size (e.g., an average size) smaller than that of the first uneven member 112a or the second uneven portion 114. At least one second uneven member 112b (e.g., a plurality of second uneven members 112b) may be positioned at each of the outer surfaces constituting the first uneven member 112a. The second uneven member 112b is formed by a method different from that of the first uneven member 112a.

For example, an average size of the second uneven member 112b (e.g., an average value of heights of the second uneven members 112b) may be a nanometer level (e.g., 1 nm to 1 µm), as an example, and may be approximately 200 nm to 500 nm. When the second uneven member 112b having the size smaller than that of the first uneven member 112a is formed, an anti-reflection effect can be improved. If the average size of the second uneven member 112b is less than 200 nm, the second uneven member 112b may be difficult to be manufactured. When the average size of the second uneven member 112b is 500 nm or less, the anti-reflection effect can be further enhanced. Also, a deviation of sizes of the first uneven members 112a may have a second deviation which is smaller than the first deviation of the first uneven members 112a. This is because the average size of the second uneven member 112b is smaller than that of the first uneven member 112a, and a process of forming the second uneven member 112b is performed by isotropic etching. As described above, in the embodiment, uniform and fine second uneven members 112b are formed at the outer surfaces of the first uneven member 112a.

The second uneven member 112b may be formed by isotropic etching using a dry etching process. As the dry etching process, for example, a reactive ion etching (RIE) process may be used. According to the reactive ion etching process, the second uneven members 112b can be formed finely and uniformly, and the second uneven members 112b can be formed only on the front surface of the semiconductor substrate 10 where light is mainly incident because a single-sided etching is possible in the reactive ion etching process. The process of forming the second uneven member 112b will be described later in more detail. Embodiments of the invention are not limited to the above shape, average size, deviation of the sizes, etc. of the second uneven member 112b, and thus, the shape, the average size, the deviation of the sizes, etc. of the second uneven member 112b may be variously modified.

When the first uneven portion 112 includes the first uneven member 112a, which is the texturing uneven member formed by the texturing process, and the second uneven member 112b, which is a fine uneven member formed by the dry etching process, optical loss at the front surface of the semiconductor substrate 10 can be minimized.

As another example, as shown in FIG. 6, a first uneven portion 112 may be formed of a second uneven member 112b. The description of the second uneven member 112b with reference to FIG. 5 may be applied to the second uneven member 112b of the present embodiment in the same manner. In this instance, the second uneven portion 112 formed of the second uneven member 112b may be formed by only performing a process for forming the second uneven member 112b (e.g., a dry etching process, more specifically, a reactive ion etching process). Alternatively, when a process (e.g., a dry etching process, more specifically, a reactive ion etching process) for forming the second uneven member 112b is performed after forming the first uneven member 112a by a texturing process, only the second uneven member 112b may be remained in a final structure in an instance that a shape of the first uneven member 112a is substantially collapsed or a height of first uneven member 112a is reduced during the dry etching process and thus the first uneven member 112a may not be discriminated from the second uneven member 112b.

As described above, the first uneven portion 112 formed of the second uneven member 112b can effectively reduce the reflection by fine uneven portions.

The second uneven portion 114 formed at the back surface of the semiconductor substrate 10 has a pyramid shape similar to that of the first uneven member 112a but end portions (that is, the peak 1141 and the valley 1142) of the pyramid shape is rounded. That is, the peak 1141 and the valley 1142 of the second uneven portion 114 may be formed of curved surfaces having constant curvatures radiuses R1 and R2. The curvature radius R1 of the peak 1141 and the curvature radius R2 of the valley 1142 may be the same or different from each other. In embodiments of the invention, reference to the pyramid shape being rounded may refer to non-sharp (or less sharp) or non-pointed (or less pointed) ends or tips. Also, truncated ends or tips are also within the scope of the embodiments.

The second uneven portion 114 may be formed by isotropically etching pointed ends of the first uneven member 112a. That is, the second uneven portion 114 has four (4) of the (111) outer surfaces, and the peak 1141 and the valley 1142 that are the end portions are rounded. For example, the second uneven portion 114 may have a rounded pyramid shape. However, embodiments of the invention are not limited thereto, and the second uneven portion 114 may be rounded as a whole.

As described above, in the embodiment, the first uneven portion 112 formed at the front surface of the semiconductor substrate 10 includes the first uneven member 112a and the second uneven member 112b having the average size smaller than that of the first uneven member 112a, and thus, the reflection that may occur at the front surface of the semiconductor substrate 10 can be minimized. On the other hand, the second uneven portion 114 is formed of the rounded uneven member having the rounded ends portions, the reflectivity at the back surface can be reduced and properties of the back surface can be enhanced while problems caused by a mirror-polishing process can be prevented or reduced.

For example, reflectance (e.g., average weight reflection (AWR)) of the back surface of the semiconductor substrate 10 for visible light (that is, light having a wavelength of 400 to 1100 nm) may be in a range of 15% to 30% by the second uneven portion 114 having the rounded end portions. On the other hand, in an instance of mirror-polishing, reflectance is 40% or more, which is very high, and thus, it is difficult to sufficiently utilize the light penetrating through the back surface. The reflectance for visible light at the front surface of the semiconductor substrate 10 may be 12% or less by the first uneven portion 112. As a result, the reflection at the front surface of the semiconductor substrate 10, in which a large amount of light is incident, can be effectively reduced by the first uneven portion 112. The effect of the second uneven portion 114, which will be described later, can be realized by the rounded end portions while reducing the reflection at the back surface of the semiconductor substrate 10 as well.

In the embodiment, the second uneven portion 114 is the rounded uneven member formed at the back surface of the semiconductor substrate 10 on which the second conductive region 30 is formed. The second conductive region 30 is a semiconductor layer different from the semiconductor substrate 10. When the second conductive region 30 is formed of the separate semiconductor layer, a size of the second uneven portion 114 (an average size of the second uneven portions 114) is larger than a thickness of the second conductive region 30.

For example, since the second uneven portions 114 are formed by rounding only the end portions of the first uneven portions 112a, an average size (e.g., an average height) of the second uneven portions 114 may be equal to or similar to that of the first uneven member 112a. For example, the average size (e.g., the average height) of the second uneven portions 114 may be a micrometer level (e.g., 1 μm to 1 mm), and may be, as an example, approximately 1 μm to 30 μm (e.g., 1 μm to 20 μm). The thickness of the second conductive region 30 may be 500 nm or less (e.g., 100 nm to 500 nm). If the thickness of the second conductive region 30 exceeds 500 nm, a manufacturing process time may increase. If the thickness of the second conductive region 30 is less than 100 nm, the second conductive region 30 may be difficult to be formed to have a uniform thickness, and the second electrode 44 may penetrate through the second conductive region 30 undesirably. However, embodiments of the invention are not limited thereto.

Since the second conductive region 30 has a relatively thin thickness, a first surface (i.e., the lower surface of the drawing) of the second conductive region 30, which faces the second passivation layer 32 or the second electrode 44, and a second surface of the second conductive region 30 opposite to the first surface of the second conductive region 30 may have uneven portions corresponding to the second uneven portion 114. Also, a first surface of the second electrode 44 that is adjacent to (e.g., is in contact with) the second conductive region 30 may have an uneven portion corresponding to the second uneven portion 114. Then, a contact area between the second conductive region 30 and the second electrode 44 can be increased and thus a contact property of the second electrode 44 can be enhanced.

In this instance, a second surface of the second electrode 44 opposite to the first surface of the second electrode 44 may have an uneven portion corresponding to the second uneven portion 114 or may not have the uneven portion depending on a forming method or a thickness of the second electrode 44. For example, when the second electrode 44 is formed by printing, a thickness of the second electrode 44 may be equal to or greater than an average height of the second uneven portion 114. For example, a thickness of the second electrode 44 may be 10 μm to 30 μm. In this instance, the second surface of the second electrode 44 does not have the uneven portion corresponding to the second uneven portion 114 as shown in the drawing. On the other hand, when the second electrode 44 is formed by sputtering or the like, a thickness of the second electrode 44 may be equal to or less than an average height of the second uneven portion 114, and may have the uneven portion corresponding to the second uneven portion 114, unlike the drawing.

Uneven portions corresponding to the second uneven portions 114 may be formed at both surfaces of the second passivation layer 32 having a thickness smaller than the size of the second uneven portion 114.

The uneven portions formed at the second conductive region 30, the second electrode 44 and/or the second passivation layer 32 to correspond to the second uneven portions 114 may have rounded end portions, like the second uneven portions 114.

In the solar cell 100 in which the average height of the second uneven portions 114 is larger than the thickness of the second conductive region 30 as described above, when the second uneven portion 114 has the rounded end portions, a passivation property can be enhanced, a junction property with the second conductive region 30 can be excellent, and the second conductive region 30 can be formed more stably.

In this structure, if an uneven portion having pointed end portions is formed at the back surface unlike the embodiment, a metal material included in the second electrode 44 may penetrate through the second conductive region 30 and may easily reach the pointed end portions of the uneven portion in a process of forming the second electrode 44. In this instance, reactivity between the second electrode 44 and the pointed end portions is very high, and thus, they may react with each other and properties of the back surface of the semiconductor substrate 10 may be deteriorated, thereby causing problems such as a surface recombination. In the structure in which the semiconductor substrate 10 and the second conductive region 30 are formed separately from each other as in the embodiment, in order to move carriers from the semiconductor substrate 10 to the second conductive region 30, the properties of the back surface of the semiconductor substrate 10, which is a boundary between the semiconductor substrate 10 to the second conductive region 30, should be excellent. Thus, if the properties of the back surface of the semiconductor substrate 10 are deteriorated due to the pointed end portions of the uneven portion formed at the back surface, the carrier may not move smoothly. As a result, efficiency of the solar cell 100 may be significantly reduced.

On the other hand, when the second uneven portion 114 has the rounded end portions as in the embodiment, reactivity between the end portions of the second uneven portion 114 and the second electrode 44 is small, and thus, properties of the back surface of the semiconductor substrate 10 can be prevented from being deteriorated or the back surface of the semiconductor substrate 10 can be prevented from being damaged in the process of forming the second electrode 44 or so on.

As another example, if the back surface of the semiconductor substrate 10 is entirely mirror-polished, an etching solution for mirror-polishing should be applied only to the back surface of the semiconductor substrate 10, and only the back surface of the semiconductor substrate 10 should be mirror-polished. However, in this instance, even when a process is precisely controlled, the etching solution for mirror-polishing may penetrate or reach the front surface of the semiconductor substrate 10, and thus, a shape of the first uneven portion 112 may be changed or damaged undesirably, for example, a shape of the first uneven portion 112 may be crushed. Then, reflection of light at the front surface of the semiconductor substrate 10 occurs and amount of generated current of the solar cell 100 may be lowered. Also, if the front surface of the semiconductor substrate 10 is excessively etched during the mirror-polishing, a part of the semiconductor substrate 10 may be stained or discolored, thereby inducing failure of the solar cell 100.

On the other hand, when the second uneven portions 114 are formed of the rounded uneven members having the rounded end portions as in the embodiment, it is possible to prevent problems that may be generated by mirror-polishing as described above.

As described above, according to the embodiment, by forming the second uneven portion 114, which is the rounded uneven member, at one surface of the semiconductor substrate 10 on which the second conductive region 30 formed of the semiconductor layer separated from the semiconductor substrate 10 is formed, problems that may be caused by the mirror-polishing process can be prevented since the mirror-polishing process is not performed while the reflectance at the one surface can be reduced and interface properties at the one surface can be enhanced. Thus, efficiency and reliability of the solar cell 100 can be improved. Also, by forming the first uneven portion 112 having a shape different from that of the second uneven portion 114 at the other surface of the semiconductor substrate 10 opposite to the one surface, reflection at the other surface can be minimized.

An embodiment of a method of manufacturing the solar cell 100 having the first and second uneven portions 112 and 114 described above will be described in detail with reference to FIGS. 8A to 8F. The detailed description for portions that were already described above will be omitted and portions that were not described above will be described in detail.

FIG. 8A to 8F are cross-sectional views showing a method of manufacturing a solar cell 100 according to an embodiment of the invention.

Figure 8A:
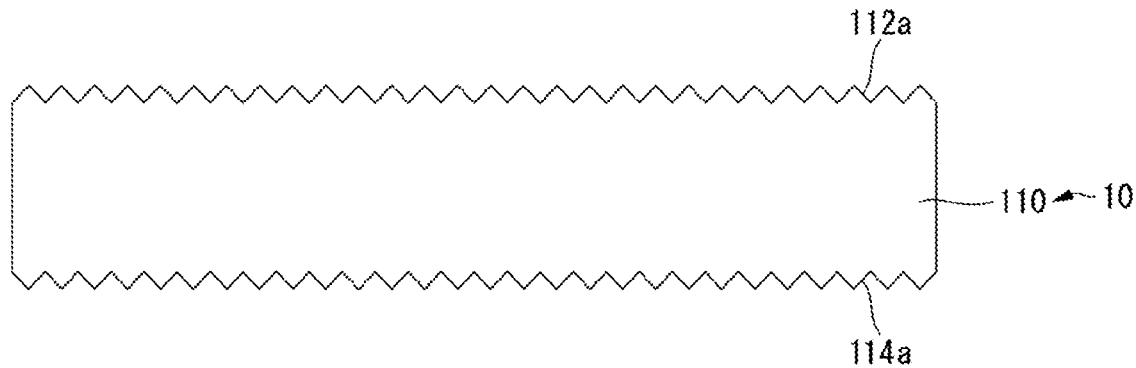
FIG. 8A to 8F are cross-sectional views showing a method of manufacturing a solar cell according to an embodiment of the invention.

First, as shown in FIG. 8A, first uneven members 112a and 114a are formed at both surfaces of a semiconductor substrate 10. More specifically, in the embodiment, first uneven members 112a are formed at a front surface of the semiconductor substrate 10, and first uneven members 114a are formed at a back surface of the semiconductor substrate 10.

For example, in the embodiment, the first uneven members 112a and 114a may be formed by wet etching. As an etching solution used for the wet etching, an alkali solution (e.g., a solution including potassium hydroxide (KOH)) may be used. According to such wet etching, the first uneven members 112a and 114a can be formed at the surfaces of the semiconductor substrate 10 by a simple process in a short time. In this instance, a dipping process in which the semiconductor substrate 10 is dipped in the etching solution so that both surfaces of the semiconductor substrate 10 are etched at the same time may be used. Then, the first uneven members 112a and 114a formed at the front surface and the back surface of the semiconductor substrate 10 can be formed together at the same time by one dipping process, so that the process can be simplified.

According to such wet etching, the first uneven members 112a and 114a are etched along crystal planes of the semiconductor substrate 10. Then, the first uneven members 112a and 114a may have a pointed pyramid shape. That is, outer surfaces of the first uneven members 112a and 114a are formed of a predetermined crystal surface (e.g., the (111) surface) and end portions (i.e., a peak and a valley) of the pointed pyramid shape is pointed or sharp.

Figure 8B:
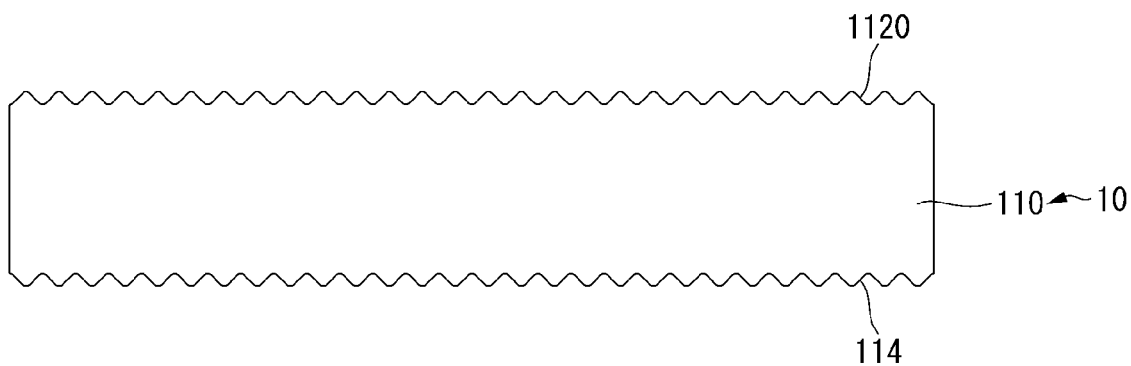

Next, as shown in FIG. 8B, second uneven portions 114 that are rounded uneven members are formed by rounding end portions of the first uneven members 114a formed at the back surface of the semiconductor substrate 10. In the embodiment, the rounding process may be performed using ozone, and more specifically, the rounding process may be performed by a dipping process using an etching solution in which ozone is dissolved. In this instance, the etching solution may be prepared by dissolving ozone in a diluted hydrofluoric acid or hydrogen peroxide solution. For example, when bubbled ozone is supplied to a diluted hydrofluoric acid or hydrogen peroxide solution, at least a portion of the bubbled ozone is dissolved in the diluted hydrofluoric acid or hydrogen peroxide solution and acts on the rounding of the end portion of the first uneven member 114a.

The etching solution including ozone forms the second uneven portion 114 by rounding the peak and the valley of the first uneven member 114a formed at the back surface of the semiconductor substrate 10. The etching solution in which the ozone is dissolved can effectively round the peak and the valley of the first uneven member 114a at the back surface of the semiconductor substrate 10. For example, a concentration of ozone in the etching solution may be 1 ppm or more. This is because the peak and the valley of the first uneven member 114a can be rounded stably in the above discussed range.

In the embodiment, the dipping process in which the semiconductor substrate 10 is dipped in the etching solution is applied to simplify a process and improve productivity. In this instance, if the process of forming the first uneven members 112a and 114a is performed by the dipping process as described above, the first uneven members 112a and 114a are formed using a dipping apparatus, and then, the end portions of the first uneven members 112a and 114a are rounded using the dipping apparatus for the first uneven members 112a and 114a by only changing an etching solution. As a result, productivity can be further improved.

As described above, when the dipping process is used in the rounding process, both of the front surface and the back surface of the semiconductor substrate 10 may be immersed in the etching solution. Therefore, the first uneven members 112a are also rounded to form rounded uneven portions 1120 at the front surface. However, embodiments of the invention are not limited thereto. When the back surface of the semiconductor substrate 10 is immersed or contacted with the etching solution and the front surface of the semiconductor substrate 10 is not immersed or contacted with the etching solution, the first uneven member 112a having pointed end portions may remain as is.

In the embodiment, it is exemplified that the second uneven portion 114 having rounded end portions is formed by rounding the end portions of the first uneven member 114a after forming the first uneven member 114a having pointed end portions at the back surface of the semiconductor substrate 10 in the texturing process. However, embodiments of the invention are not limited thereto. The rounded uneven portion 1120 and/or the second uneven portion 114 may be formed by further adding an additive or the like which rounds the end portions in the texturing process.

Figure 8C:
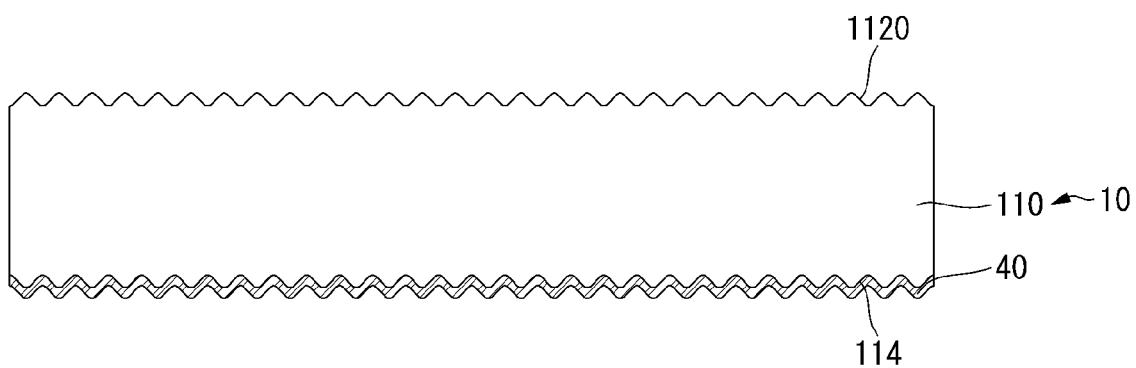

Next, as shown in FIG. 8C, a control passivation layer 40 is formed on the back surface of the semiconductor substrate 10. The control passivation layer 40 may be formed by any of various methods such as vapor deposition, thermal oxidation, chemical oxidation, and so on.

In this instance, in the embodiment, the control passivation layer 40 may be formed of a silicon oxide layer formed by chemical oxidation using a dipping process. Then, the control passivation layer 40 may be formed using the same dipping apparatus for the first uneven members 112a and 114a and/or for the rounding process by only changing an etching solution. As a result, productivity can be improved.

In the embodiment, the method of manufacturing the solar cell 100 including the control passivation layer 40 as shown in FIG. 3 is described as an example. However, embodiments of the invention are not limited thereto. A process of forming the control passivation layer 40 need not be performed in the method of manufacturing the solar cell 100 that does not include the control passivation layer 40.

Figure 8D:
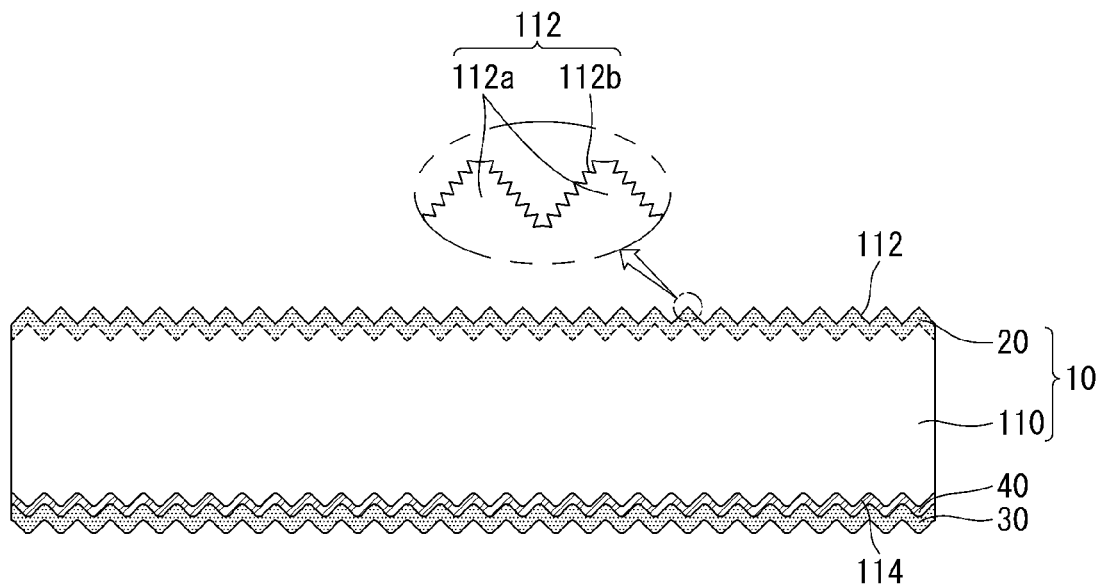

Next, as shown in FIG. 8D, a second uneven member 112b is formed at the front surface of the semiconductor substrate 10 to form a first uneven portion 112 having the first uneven member 112a and the second uneven member 112b. A first conductive region 20 may be formed at the front surface of the semiconductor substrate 10 and a second conductive region 30 may formed on the back surface of the semiconductor substrate 10 before or after the process of forming the second uneven member 112b.

As an example, in the embodiment, the second uneven member 112b may be formed by a reactive ion etching process. The reactive ion etching process is a dry etching process in which etching is induced in the state that a plasma is generated after an etching gas (e.g., $Cl_2$, $SF_6$, $NF_3$, HBr, etc.) is supplied. Fine and uniform second uneven members 112b can be formed at the front surface of the semiconductor substrate 10 by the reactive ion etching process regardless of a direction of crystal grains. In this instance, the second uneven member 112b may have a pointed or sharp top end portion. Since the reactive ion etching process is a single-sided etching, the second uneven member 112b may be formed only at the front surface of the semiconductor substrate 10 so as not to affect the back surface of the semiconductor substrate 10. The second uneven member 112b is finer in size than that of the first uneven member 112a.

Thus, the first uneven portion 112 including the first and second uneven members 112a and 112b can be formed by a simple process. However, embodiments of the invention are not limited thereto. Therefore, the first uneven portion 112 may be formed only of the first uneven member 112a so that the second uneven member 112b is not formed at the front surface of the semiconductor substrate 10 and the rounding process is not performed. Alternatively, the first uneven portion 112 may be formed only of the second uneven member 112b. That is, the texturing process for forming the first uneven member 112a may not be performed or the first uneven member 112a may not be distinguished because the first uneven member 112a may be deformed or removed when the second uneven member 112b is formed.

The first conductive region 20 may be formed by a doping process in which a part of the semiconductor substrate 10 is doped with a first conductivity type dopant supplied from an outside. As the doping process, any of various methods may be applied. For example, an ion implantation process, a thermal diffusion process in which a heat treatment using a gas including a first conductivity type dopant is performed, a thermal process performed after forming a doping layer including a first conductivity type dopant, a laser doping process, or so on may be applied.

The second conductive region 30 may be formed by forming a semiconductor layer having a second conductivity type dopant through using any of various methods. For example, the semiconductor layer may be formed by a thermal growth method, a deposition method (e.g., low pressure chemical vapor deposition (LPCVD)), or the like. The second conductivity type dopant may be included in the semiconductor layer when the semiconductor layer is formed, or may be included in the semiconductor layer by performing a separate doping process after forming the semiconductor layer. When the second conductivity type dopant is included in the semiconductor layer when the semiconductor layer is formed, the process can be simplified. Any of various methods known as separate doping processes performed after semiconductor layer formation may be used. For example, an ion implantation process, a thermal diffusion process in which a heat treatment using a gas including a second conductivity type dopant is performed, a thermal process performed after forming a doping layer including a second conductivity type dopant, a laser doping process, or so on may be applied. Embodiments of the invention are not limited thereto.

In embodiments of the invention, an order of the process of forming the second uneven member 112b, the process of forming the first conductive region 20, and the process of forming the second conductive region 30 is not limited. For example, the second conductive region 30 may be formed first, then the second uneven member 112b may be formed, and then the first conductive region 20 may be formed. Then, the second conductivity type dopant diffused into the semiconductor substrate 10 when forming the second conductive region 30 can be removed when forming the second uneven member 112b. However, embodiments of the invention are not limited thereto.

Figure 8E:
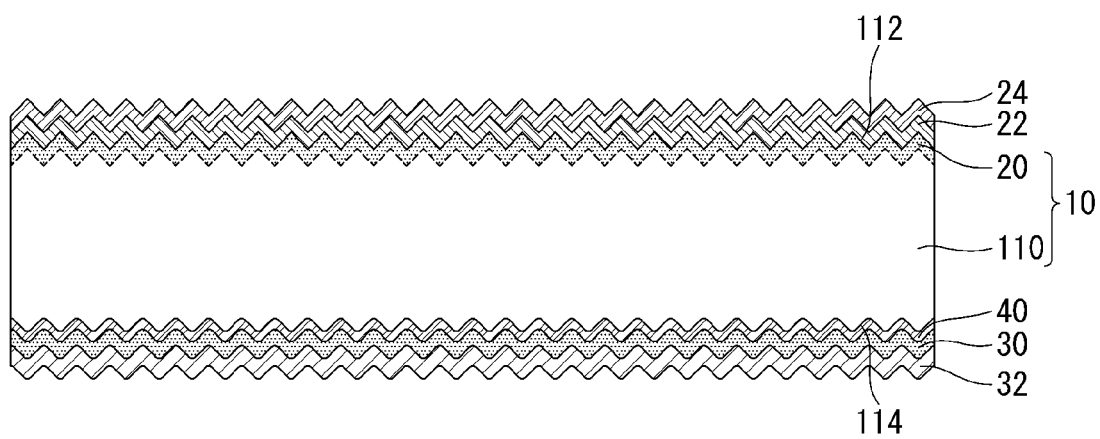

Next, as shown in FIG. 8E, an insulating layer is formed on the surfaces of the semiconductor substrate 10. That is, a first passivation layer 22 and an anti-reflection layer 24 are formed on the front surface of the semiconductor substrate 10, and a second passivation layer 32 is formed on the back surface of the semiconductor substrate 10. The first passivation layer 22, the anti-reflection layer 24, or the second passivation layer 32 may be formed by any of various methods such as a vacuum deposition method, a chemical vapor deposition method, a spin coating method, a screen printing method, or a spray coating method. An order of the process of forming the first passivation layer 22, the process of forming the anti-reflection layer 24, and the process of forming the second passivation layer 32 is not limited in embodiments of the invention.

Figure 8F:
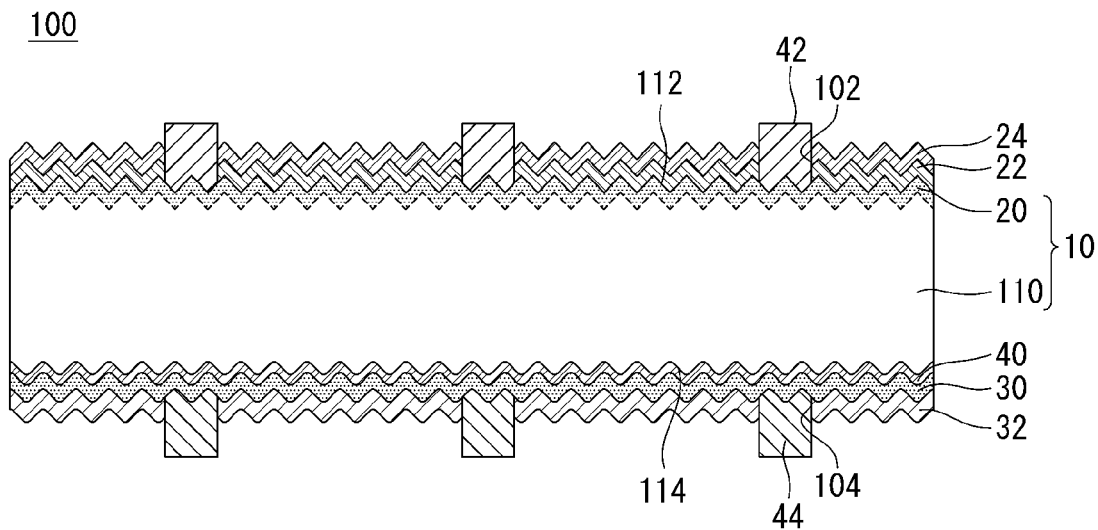

Next, as shown in FIG. 8F, first and second electrodes 42 and 44 electrically connected to the first and second conductive regions 32 and 34, respectively, are formed.

For example, pastes for forming first and second electrodes may be coated on the insulating layer by a printing process (e.g., a screen printing process), and then, a fire-through process or a laser firing contact process may performed for forming the first and second electrodes 42 and 44 having the above-described shape. In this instance, since openings 102 and 104 are formed at the time of forming the first and second electrodes 42 and 44, a process of forming the openings 102 and 104 may not be separately performed. Also, the first and second electrodes 42 and 44 can be formed by an easy and simple process using a printing process.

However, embodiments of the invention are not limited thereto. As another example, the openings 102 and 104 are formed at the insulating layer by a patterning process, and then, the first and second electrodes 42 and 44 are formed while filling the openings 102 and 104. In this instance, the openings 102 and 104 may be formed by any of various methods using a laser ablation process using a laser, or using an etching solution, etch paste, or the like. The first and second electrodes 42 and 44 may be formed by any of various methods such as a sputtering method, a plating method, and a deposition method.

According to the embodiment, the second uneven portion 114 formed of the rounded uneven member can be formed by a simple process, and the solar cell 100 having excellent efficiency and reliability can be manufactured with high productivity.

Hereinafter, embodiments of the invention will be described in more detail with reference to experimental examples of the invention. However, the experimental examples of the invention are only for illustrating the invention, and embodiments of the invention are not limited thereto.

Embodiment

Second uneven portions of rounded uneven members were formed at a back surface of a semiconductor substrate. In this instance, first uneven members were formed by a texturing process using a potassium hydroxide solution, and then, the second uneven portions were formed by rounding end portions of the first uneven members by using a diluted hydrofluoric acid solution in which ozone was dissolved.

Comparative Example

A back surface of a semiconductor substrate was polished by mirror-polishing so that an uneven portion was not provided at the back surface.

Figure 9:
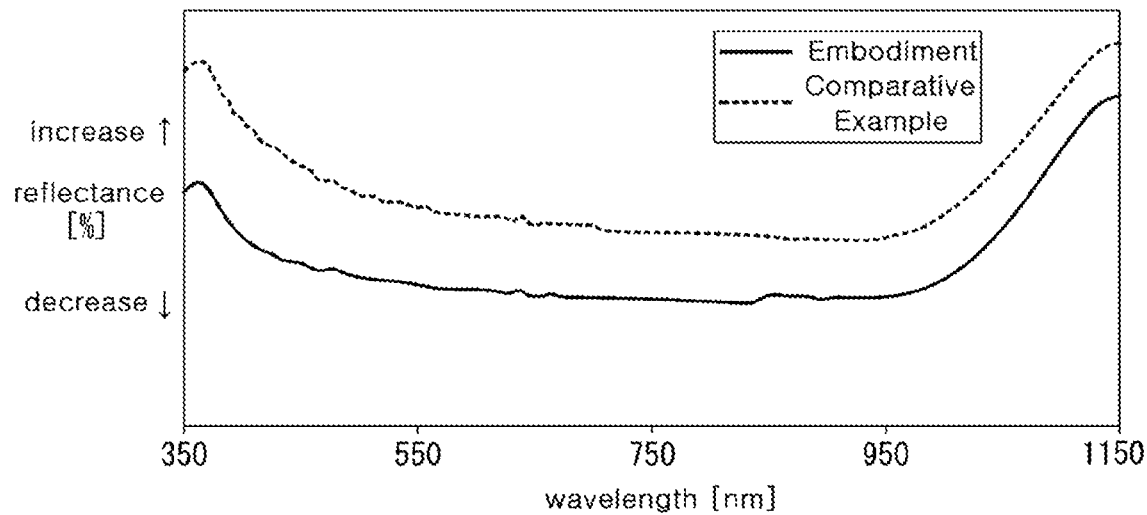
FIG. 9 is a graph showing reflectance at a back surface of a semiconductor substrate according to an Embodiment of the invention and reflectance at a back surface of a semiconductor substrate according to a Comparative Example.

Reflectance at the back surface of the semiconductor substrate according to the Embodiment and reflectance at the back surface of the semiconductor substrate according to the Comparative Example were measured and the result is shown in FIG. 9.

Referring to FIG. 9, it can be seen that the reflectance at the back surface of the semiconductor substrate according to the Embodiment is lower than that at the back surface of the semiconductor substrate according to the Comparative Example. As a result, it can be seen that the reflectance at the back surface of the semiconductor substrate can be lowered by the second uneven portions which are rounded uneven members.

The features, structures, effects and the like according to the above description are included in at least one embodiment of the invention and are not necessarily limited to one embodiment. Further, the features, structures, effects and the like illustrated in the embodiments may be combined and modified with respect to other embodiments by persons skilled in the art to which the embodiments belong without undue experimentation. Therefore, it is to be understood that embodiments of the invention are not limited to these embodiments.

What is claimed is:

1. A method of manufacturing a solar cell, the method comprising:
    obtaining a semiconductor substrate having a first surface and a second surface opposite to the first surface;
    forming a first uneven member on the first surface of the semiconductor substrate, the first uneven member having a pointed pyramidal shape;
    forming a second uneven member on the second surface of the semiconductor substrate, the second uneven member having a pointed pyramidal shape;
    removing portions of the second uneven member on the second surface of the semiconductor substrate to form a rounded uneven member having a rounded end portion, wherein the first uneven member having a pointed pyramidal shape on the first surface of the semiconductor substrate is preserved while forming the rounded uneven member having a rounded end portion;
    forming a first conductive region at the first surface of the semiconductor substrate such that the first conductive region is arranged over the first uneven member having a pointed pyramidal shape;
    forming a second conductive region on the second surface of the semiconductor substrate, wherein the second conductive region comprises a semiconductor layer different from the semiconductor substrate, and wherein the second conductive region is arranged over the rounded uneven member having a rounded end portion;
    forming a first electrode electrically connected to the first conductive region; and
    forming a second electrode electrically connected to the second conductive region.

2. The method of claim 1, wherein the first surface of the semiconductor substrate comprises a plurality of first uneven members, and wherein a pointed valley portion is arranged between adjacent first uneven members of the plurality of first uneven members.

3. The method of claim 1, wherein the rounded end portion is formed by using ozone.

4. The method of claim 3, wherein the rounded end portion is formed by a dipping process, and
    wherein in the dipping process, the semiconductor substrate is dipped in an etching solution.

5. The method of claim 4, wherein the etching solution is formed by dissolving the ozone in a diluted hydrofluoric acid or hydrogen peroxide solution.

6. The method of claim 1, further comprising:
forming a control passivation layer on the second surface of the semiconductor substrate after forming the rounded uneven member and before forming the second conductive region, wherein the forming of the control passivation layer is performed by a dipping process.

7. The method of claim 1, further comprising:
performing a reactive ion etching process to the first uneven member on the first surface of the semiconductor substrate to form a third uneven member, the third uneven member formed on outer surfaces of the first uneven member.

8. The method of claim 7, wherein the first uneven member and the second uneven member are formed by anisotropic etching, and wherein the third uneven member is formed by isotropic etching.

9. A method of manufacturing a solar cell, the method comprising:
obtaining a semiconductor substrate having a first surface and a second surface opposite to the first surface;
dipping the semiconductor substrate into a first etching solution such that the first surface and the second surface are etched at a same time to form a plurality of first uneven members on the first surface of the semiconductor substrate and a plurality of second uneven members on the second surface of the semiconductor substrate, wherein each of the plurality of first uneven members has a pyramidal shape with pointed peaks, and wherein each of the plurality of second uneven members has a pyramidal shape with pointed peaks;
dipping the second surface of the semiconductor substrate into a second etching solution to round the second uneven members, thereby forming a plurality of rounded uneven members from the plurality of second uneven members, the rounded uneven members each having a pyramidal shape with rounded peak;
forming a passivation layer on the plurality of rounded uneven members of the second surface of the semiconductor substrate;
forming a first conductive region on plurality of first uneven members of the first surface of the semiconductor substrate; and
forming a second conductive region on the passivation layer.

10. The method of claim 9, further comprising:
filling a dipping apparatus with the first etching solution before dipping the semiconductor substrate into the first etching solution;
removing the first etching solution from the dipping apparatus after dipping the semiconductor substrate into the first etching solution; and
filling the dipping apparatus with the second etching solution before dipping the second surface of the semiconductor substrate into the second etching solution.

11. The method of claim 9, wherein the passivation layer is formed by a dipping process using a third etching solution.

12. The method of claim 11, wherein a same dipping apparatus is for each dipping step of the method.

13. The method of claim 9, wherein the first surface of the semiconductor substrate remains outside of the second etching solution during the dipping of the second surface of the semiconductor substrate in the second etching solution such that after the dipping of the second surface of the semiconductor substrate, each of the plurality of first uneven members on the first surface of the semiconductor substrate still has a pyramidal shape with pointed peaks.

14. The method of claim 9, further comprising:
removing portions of outer surfaces of the plurality of first uneven members to form a plurality of third uneven members on each outer surface of the plurality of first uneven members,
wherein after the forming of the plurality of third uneven members, the plurality of first uneven members have truncated peaks, and
wherein the forming of the plurality of third uneven members is performed before forming the first conductive region on the first surface of the semiconductor substrate.

15. The method of claim 9, further comprising:
forming a first electrode electrically connected to the first conductive region; and
forming a second electrode electrically connected to the second conductive region.

16. A method of manufacturing a solar cell, the method comprising:
forming first uneven members on a first surface of a semiconductor substrate and on a second surface of the semiconductor substrate, the first surface being opposite to the second surface, wherein each first uneven member has a pyramidal shape with pointed peaks, and wherein pointed valleys are arranged between adjacent first uneven members;
forming second uneven members on the second surface of the semiconductor substrate by rounding the pointed peaks of the first uneven members on the second surface of the semiconductor substrate, wherein rounded valleys are arranged between adjacent second uneven members on the second surface of the semiconductor substrate;
forming third uneven members on outer surfaces of the first uneven members, wherein a different forming process is used to form the third uneven members than the first uneven members, and wherein the second uneven members maintain rounded peaks during and after the forming of the third uneven members; and
forming a first conductive region on the first surface of the semiconductor substrate; and
forming a second conductive region on the second surface of the semiconductor substrate.

17. The method of claim 16, wherein the third uneven members are formed by a single-sided reactive ion etching process.

18. The method of claim 16, wherein each first uneven member has a height greater than or equal to a micrometer, and wherein each third uneven member has a height between 1 nanometer and 500 nanometers.

19. The method of claim 16, wherein the forming of the first uneven members is conducted using anisotropic etching, and wherein the forming of the third uneven members is conducted using isotropic etching.

20. The method of claim 16, wherein after the forming of the third uneven members on the outer surfaces of the first uneven members, the first uneven members have planarized peaks.

* * * * *